United States Patent
Gaylord et al.

(10) Patent No.: US 8,664,012 B2
(45) Date of Patent: Mar. 4, 2014

(54) COMBINED SILICON OXIDE ETCH AND CONTAMINATION REMOVAL PROCESS

(75) Inventors: Richard H. Gaylord, Saratoga Springs, NY (US); Blaze J. Messer, Albany, NY (US); Kaushik A. Kumar, Poughkeepsie, NY (US)

(73) Assignee: Tokyo Electron Limited, Tokyo (JP)

( * ) Notice: Subject to any disclaimer, the term of this patent is extended or adjusted under 35 U.S.C. 154(b) by 77 days.

(21) Appl. No.: 13/250,960

(22) Filed: Sep. 30, 2011

(65) Prior Publication Data
US 2013/0084654 A1 Apr. 4, 2013

(51) Int. Cl.
*H01L 21/02* (2006.01)

(52) U.S. Cl.
USPC .............. 438/5; 438/774; 438/906; 438/974

(58) Field of Classification Search
USPC .......................................................... 438/5
See application file for complete search history.

(56) References Cited

U.S. PATENT DOCUMENTS

| | | | |
|---|---|---|---|
| 6,066,572 A * | 5/2000 | Lu et al. .................. | 438/774 |
| 6,087,267 A | 7/2000 | Dockrey et al. | |
| 6,214,736 B1 | 4/2001 | Rotondaro et al. | |
| 6,423,646 B1 | 7/2002 | Yen et al. | |
| 6,790,733 B1 * | 9/2004 | Natzle et al. ............ | 438/300 |
| 2003/0032831 A1 * | 2/2003 | Yoshisato et al. ....... | 558/274 |
| 2004/0038546 A1 | 2/2004 | Ko | |
| 2006/0211224 A1 * | 9/2006 | Matsuda .................. | 438/493 |
| 2007/0045228 A1 | 3/2007 | Kubota et al. | |
| 2008/0009139 A1 | 1/2008 | Hecht et al. | |
| 2008/0254631 A1 * | 10/2008 | Shimayama et al. .... | 438/700 |
| 2009/0151870 A1 * | 6/2009 | Urakawa et al. ........ | 156/345.1 |
| 2009/0233447 A1 | 9/2009 | Liang et al. | |
| 2010/0159627 A1 | 6/2010 | Partridge et al. | |
| 2011/0151674 A1 | 6/2011 | Tang et al. | |

FOREIGN PATENT DOCUMENTS

EP 0784337 A2 7/1997

OTHER PUBLICATIONS

Ying, Hong, In-Situ Remote RF Plasma Cleaning and Surface Characterization after SiO2/Si RIE, North Carolina State University, 1998, p. 62, para. 2.
International Search Report and Written Opinion issued in corresponding PCT Application No. PCT/US12/55288 mailed Dec. 24, 2012, 8 pp.

* cited by examiner

*Primary Examiner* — Zandra Smith
*Assistant Examiner* — Damian A Hillman
(74) *Attorney, Agent, or Firm* — Wood, Herron & Evans, LLP

(57) ABSTRACT

A method of forming a semiconductor device. A substrate having first and second materials is provided, wherein the second material is occluded by the first material. The substrate is etched using a first non-plasma etch process that etches the first material at a higher rate relative to a rate of etching the second material. The first non-plasma etch process exposes the second material that is overlying at least a portion of the first material. The second material is then etched using a plasma containing a reactive gas, which exposes the at least a portion of the first material. The first material including the at least a portion of the first material that was exposed by etching the second material are etched using a second non-plasma etch process.

19 Claims, 8 Drawing Sheets

COMBINED SILICON OXIDE ETCH AND CONTAMINATION REMOVAL PROCESS

FIELD OF THE INVENTION

This invention relates to a system and method for treating a substrate, and more particularly to a system and method for chemical and thermal treatment of a substrate.

BACKGROUND OF THE INVENTION

During replacement metal gate ("RMG") development, a residual carbonaceous contaminant may be formed during a photo-resist step. Conventional residual resist removal may not be a viable option due to the need to leave resist in another, desired location.

Oftentimes, the carbonaceous contaminant is embedded within a void region of a trench oxide ("TO"), which makes removal by conventional etching procedures, for example, the chemical oxide removal ("COR") process, difficult. In fact, the presence of the carbonaceous contaminant prevents complete oxide removal.

There is thus a need for a process by which an oxide material may be selectively removed, in the presence of a carbonaceous contaminant, with or without damaging other layers or structures on substrate, such as a photo-resist layer.

SUMMARY OF THE INVENTION

The present invention provides a method that removes carbonaceous contaminants without damaging other structures or layers of the device. In accordance with one embodiment of the present invention, a method of forming a semiconductor device includes providing a substrate having first and second materials, wherein the second material is occluded by the first material. The first material is etched using a first non-plasma etch process that etches the first material at a higher rate relative to a rate of etching the second material. Etching the first material exposes the second material that is overlying at least a portion of the first material. The second material is then etched using a plasma containing a reactive gas, which exposes a residual first material. Etching the second material exposes the at least a portion of the first material. The first material, including the at least a portion of the first material that was exposed by etching the second material, is etched using a second non-plasma etch process.

Accordance with one embodiment of the present invention, a method of forming a semiconductor device includes providing a substrate having an oxide material and a carbon material that is occluded by the oxide material. The oxide material is etched using a first chemical oxide removal process that is configured to etch the oxide material at a higher rate relative to a rate of etching the carbon material. Etching the oxide material exposes the carbon material that is overlying at least a portion of the oxide material. The carbon material is etched using a plasma containing a reactive gas, which exposes the at least a portion of the oxide material. The oxide material, including the exposed at least a portion of the oxide material, is etched using etched using a second chemical oxide removal process.

Still another embodiment of the present invention is directed to a method of forming a semiconductor device that includes providing a substrate having an oxide material and a carbon material. The oxide material is etched using a non-plasma etch process that is configured to etch the oxide material at a higher rate than a rate of etching the carbon material. The non-plasma etch further exposes the carbon material. The carbon material is etched using a plasma containing a reactive gas. The oxide material is then further etched with a non-plasma etch process. The thickness of the oxide layer is determined and, based on a comparison of the determined thickness with a predetermined thickness, the etching stops or the plasma and non-plasma etch processes are repeated until the determined thickness is approximately the predetermined thickness.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1:
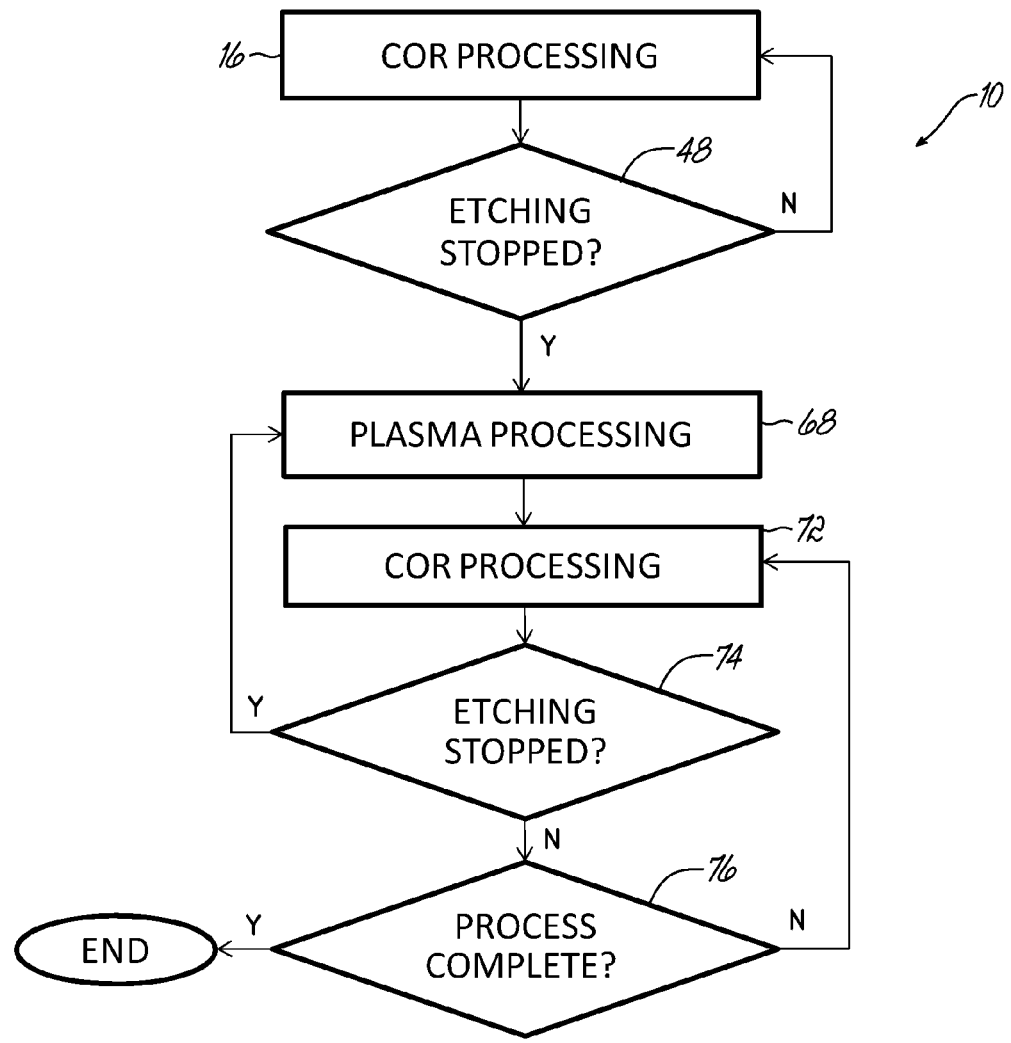
FIG. 1 is flow chart illustrating one exemplary method of forming a semiconductor device in accordance with one embodiment of the present invention.
Figure 2A:
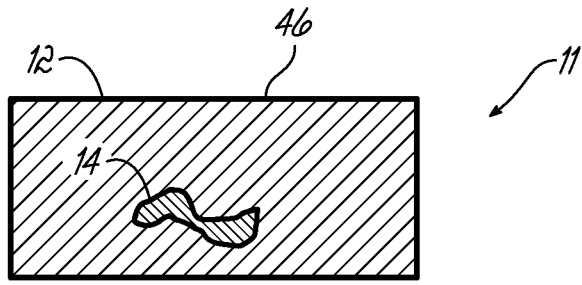
FIGS. 2A-2D are a series of cross-sectional views of a device having a substrate being processed in accordance with the method of FIG. 1.

Turning now to the figures, and in particular to FIGS. 1 and 2A, a method 10 of processing a device 11 with a substrate 12 in accordance with one embodiment of the present invention is described. The substrate 12 may comprise silicon oxide having an embedded contaminant 14. The contaminant 14 may be carbonaceous in nature, including any carbon by-product or other structure that is resistant to conventional non-plasma etching procedures. The contaminant 14 may be an artifact remaining from a photo-resist step, one or more impurities incorporated during the deposition of silicon dioxide, or a by-product that is formed during the non-plasma etching process itself.

Figure 3A:
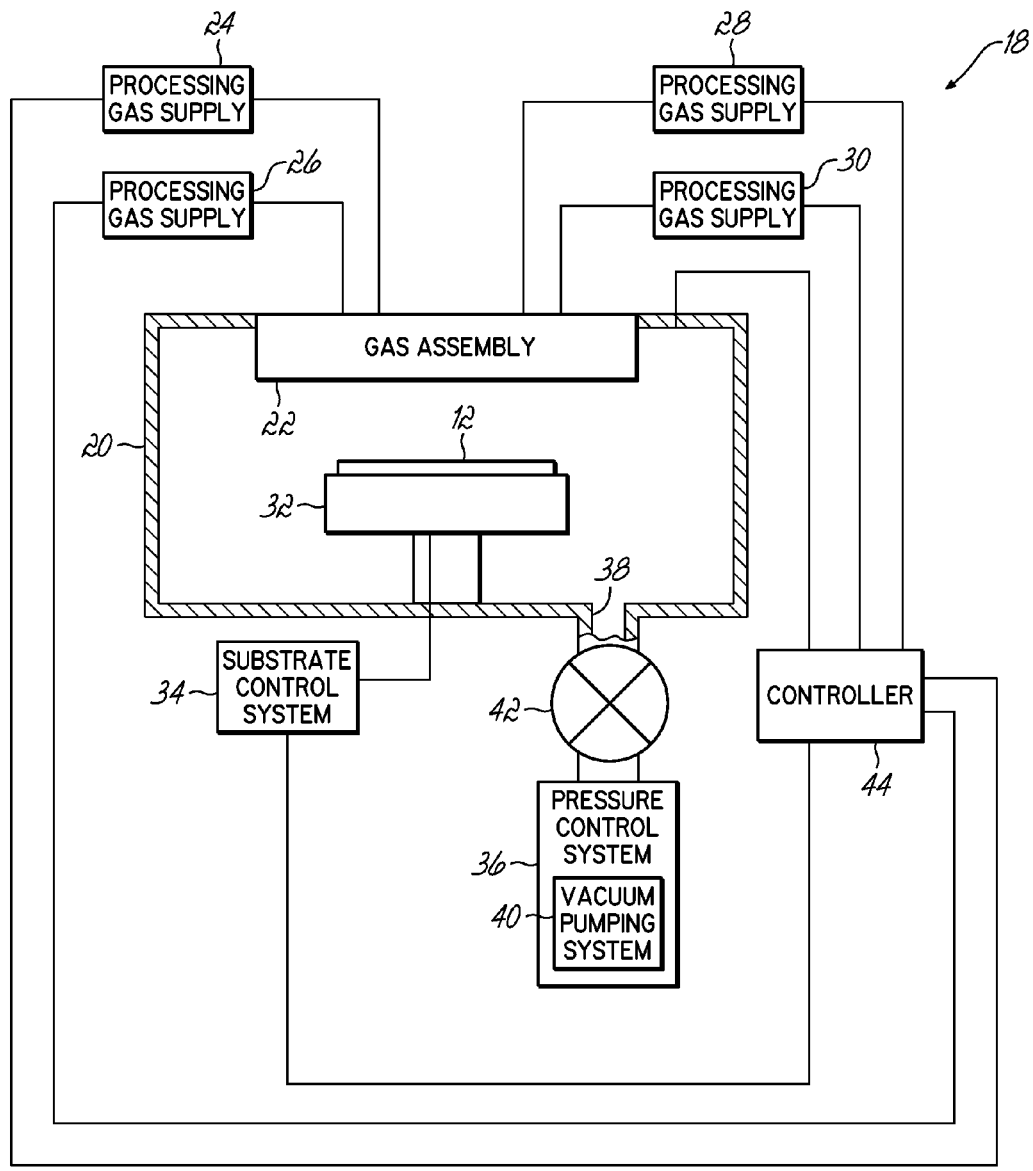
FIG. 3A is a schematic illustration of a non-plasma processing system suitable for performing at least a portion of the exemplary method of FIG. 1 in accordance with one embodiment of the present invention.

The method 10 may begin in 16 with a chemical oxide removal ("COR") process, which may be performed in a non-plasma processing system 18, such as the one shown in FIG. 3A. The processing system 18 includes a processing chamber 20 and a gas assembly 22 fluidically coupled thereto. The gas assembly 22 further includes a plurality of processing gas supplies 24, 26, 28, 30, wherein each gas supply 24, 26, 28, 30 is fluidically coupled to the processing chamber 20 and contains one or more reactant or catalyst. Reactants or catalysts may include, for example, anhydrous HF and $NH_3$. Diluent gases may be used and include inert gases, such as, He, Ne, Ar, and so forth. Though not shown, the gas assembly 22 may further include one or more pressure control devices, one or more flow control devices, one or more filters, one or more valves, and/or one or more flow sensors. The flow control devices may include pneumatic driven valves, electromechanical (solenoidal) valves, and/or high-rate pulsed gas injection valves configured to be opened rapidly to admit one or more processing gases into the processing chamber 20.

A substrate support 32 is positioned within the processing chamber 20, supports the substrate 12 thereon, and may further include a substrate control system 34 configured to control one or more parameters of the substrate, for example, a thermostat.

A pressure control system 36 is coupled to the processing chamber 20 through a duct 38 and includes a vacuum pumping system 40 and a valve 42, wherein the pressure control system 36 is configured to controllably evacuate the processing chamber 20 to a pressure suitable for the COR process. The vacuum pumping system 40 may include a turbo-molecular vacuum pump ("TMP") or a cryogenic pump that is capable of a pumping speed up to about 5000 liters per second (and greater) and the valve 42 may include a gate valve for throttling the chamber pressure. Moreover, a device (not shown) for monitoring the chamber process may be coupled to the processing chamber 20, which may include, for example, a Type 628B Baratron absolute capacitance manometer, which is commercially-available from MKS Instruments, Inc. (Andover, Mass.).

Alternatively, or in addition, a controller 44 may be coupled to one or more additional controllers/computers (not shown), which may obtain setup and/or configuration information from the additional controllers/computers. The controller 44 may be used to configure any number of the processing gas supplies and may collect, provide, process, store, and/or display data from the same. The controller 44 may comprise a number of applications for controlling one or more of the processing gas supplies 24, 26, 28, 30 and may, if desired, include a graphical user interface ("GUI," not shown) that may provide an easy to use interface for a user to monitor and/or control one or more of the processing gas supplies 24, 26, 28, 30.

Still referring to FIG. 3A, the controller 44 may comprise a microprocessor, memory, and a digital I/O port capable of generating control voltages sufficient to communicate and activate inputs to the non-plasma processing system 18, as well as monitor outputs from the non-plasma processing system 18. Moreover, the controller 44 may be coupled to and may exchange information with the processing chamber 20, the substrate support 32, the gas assembly 22, the processing gas supplies 24, 26, 28, 30, the substrate control system 34, and the pressure control system 36. For example, a program stored in a memory of the controller 44 may be utilized to activate the inputs to the aforementioned components of the processing system 18 according to a process recipe in order to perform a COR etch process. One example of the controller 44 is a DELL PRECISION WORKSTATION 610™, commercially-available from Dell Corp., (Austin, Tex.).

However, the controller 44 may be implemented as a general purpose computer system that performs a portion or all of the microprocessor-based processing steps of the present invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in the main memory. In alternative embodiments, hard-wired circuitry may be used in place of or in combination with software instructions. Thus, embodiments are not limited to any specific combination of hardware circuitry and software.

The controller 44 includes at least one computer readable medium or memory, such as the controller memory, for holding instructions programmed according to the teachings of the invention and for containing data structures, tables, records, or other data that may be necessary to implement the present invention. Examples of computer readable media are hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media resides software for controlling the controller, for driving a device or devices for implementing the present invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the present invention.

The computer code devices may be any interpretable or executable code mechanism, including but not limited to scripts, interpretable programs, dynamic link libraries ("DLLs"), Java classes, and complete executable programs. Moreover, parts of the processing of the present invention may be distributed for better performance, reliability, and/or cost.

The term "computer readable medium" as used herein refers to any medium that participates in providing instructions to the processor of the controller 44 for execution. Thus, computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller 44 for execution. For example, the instructions may initially be carried on a magnetic disk of a remote computer. The remote computer can load the instructions for implementing all or a portion of the present invention remotely into a dynamic memory and send the instructions over a network to the controller.

The controller 44 may be locally located relative to the processing system 18, or it may be remotely located relative to the processing system 18. For example, the controller 44 may exchange data with the processing system 18 using at least one of a direct connection, an intranet, the Internet, or a wireless connection. The controller 44 may be coupled to an intranet at, for example, a customer site (i.e., a device maker, etc.), or it may be coupled to an intranet at, for example, a vendor site (i.e., an equipment manufacturer). Additionally, for example, the controller 44 may be coupled to the Internet. Furthermore, another computer (i.e., controller, server, etc.) may access, for example, the controller 44 to exchange data via at least one of a direct connection, an intranet, or the Internet. As also would be appreciated by those skilled in the art, the controller 44 may exchange data with the deposition system via a wireless connection.

In use, the COR process include the rapid admission of a processing gas into the processing chamber 20. The chamber pressure is maintained, by the pressure control system 36, at a pressure that is above the condensation pressure for processing gas at the substrate temperature. Chamber pressure may range from about 1 mTorr to about 1 Torr. The process gas flow rates may range from about 1 sccm to about 200 sccm for each chemical species. The processing chamber 20 may be heated to a temperature ranging from about 30° C. to about 100° C. and, for example, the temperature may be 40° C. The gas assembly 22 and the processing gas supplies 24, 26, 28, 30 may be heated to a temperature ranging from about 40° C. to about 100° C. and, for example, the temperature may be 80° C.

While not wishing to be bound by theory, it is believed that the reactant gases condense on the exposed surface 46 of the substrate 12. The condensed reactant gases initiate the etching process. Uncondensed reactant gases and etch by-products may be evacuated from the processing chamber 20 via the duct 38 and the vacuum pumping system 40.

The COR process may produce an etch rate of the exposed surface of the substrate 12 that are in in excess of about 10 nm per 60 seconds of chemical treatment for thermal oxide, an etch rate of the exposed surface in excess of approximately 25 nm per 180 seconds of chemical treatment for thermal oxide, and an etch rate of the exposed surface in excess of approximately 10 nm per 180 seconds of chemical treatment for tetraethyl orthosiliate ("TEOS"). The COR process may also produce an etch variation across the substrate 12 of less than approximately 2.5%.

A post-COR process may be applied and may comprise a post heat treatment ("PHT") to sublime materials formed on the substrate during the COR process. The PHT step may be carried out over a range of temperatures, for example, from about 100° C. to about 1000° C. and over a chamber pressure range of about 1 mTorr to about 1 Torr. During the PHT process, a sweep gas may be used to facilitate the sublimation, including, for example, $N_2$.

Figure 2B:
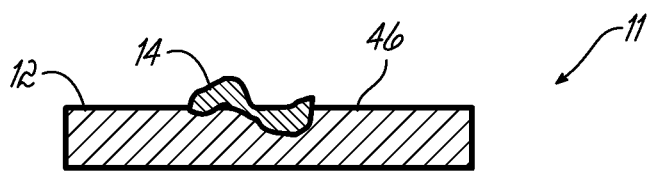

Referring again to FIGS. 1 and 2A, the COR process continues and may be evaluated via a scanning electron microscope ("SEM") to determine, in 48, whether etching has stopped. Once the exposed surface 46 of the substrate is sufficiently etched so as to expose the contaminant 14, as shown in FIG. 2B, the etching rate, as observed via the SEM, slows and may stop.

Figure 3B:
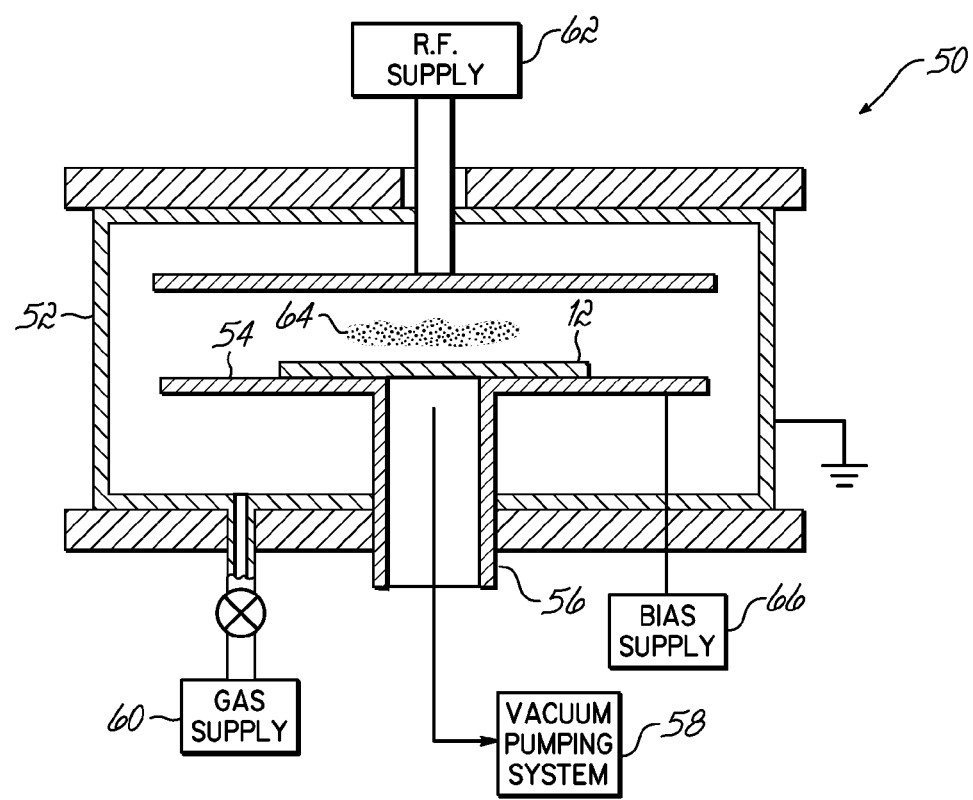
FIG. 3B is a schematic illustration of a plasma-processing system suitable for performing at least a portion of the exemplary method of FIG. 1 in accordance with one embodiment of the present invention.

When the etching rate has sufficiently slowed or stopped such that the decision in 48 is "YES", the substrate 12 may be transported from the non-plasma processing system 18 to a plasma processing system 50, one example of which is shown in FIG. 3B.

In particular, the plasma processing system 50 includes a processing chamber 52 having a substrate support 54 therein for supporting the substrate 12 thereon. An exhaust port 56 with a vacuum pumping system 58, similar to those described previously, is coupled to the processing chamber 52 for partial evacuation of the processing chamber 52, wherein chamber pressure may be less than about 150 mTorr, with chamber temperature being less than about 40° C., to enable anisotropic treatment and to resist lateral pullback of any photo-resist layer, if present. A gas supply 60, including at least one reactive gas, supplies the reactive gas to the processing chamber 52. The reactive gas may be any oxidizing or reducing strip chemistries (i.e., a redox agent), including $N_2$, $H_2$, $O_2$, $CO_2$, and $NH_3$. The gas supply 60 may further include one or more inert gases (such as, Ar, He, Ne, etc.) and/or fluorinated gases (such as, $CF_4$, $CHF_3$, $CH_2F_2$, and $CH_3F$) but should not be limited to fluorocarbon gases. The plasma processing system 50 further includes a power supply 62, such as an RF power supply, which supplies a radiofrequency ("RF") energy to the processing chamber 52. The RF energy is operable to ignite the reactant gas into a plasma 64 within the processing chamber 52 and above the substrate 12 on the substrate support 54. Generally, the RF energy may be minimized, for example, less than about 200 W, to reduce fragmentation.

The substrate support 54 may be electrically coupled to a power supply 66, which is configured to electrically bias the substrate support 54, and thus the substrate 12. Electrically biasing the substrate 12 achieves anisotropic etch conditions by acceleration of one or more specie of ions from the plasma 64, in a substantially vertical direction, to the exposed surface of the substrate 12 and into features within the substrate 12, if present. Depending on the angle of incidence, the ion energy, and various other factors, the ions impacting the exposed surface 46 etch away the contaminant 14 at the exposed surface 46 of the substrate 12 (FIG. 2B). Generally, the bias power is minimized (such as less than about 200 W) to limit sputtering from sensitive regions of the substrate 12, including photo-resist layers and so forth that are desired.

Figure 2C:
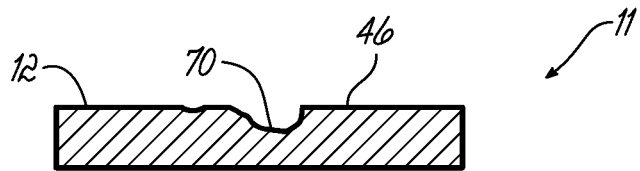

Thus, once the substrate 12, with the contaminant 14 exposed, is positioned on the substrate support 54 of the plasma processing system 50, the plasma etch process may begin in 68 (FIG. 1) by injecting the reactant gas and igniting the plasma 64. With continued plasma etch processing, the contaminant 14 is removed and a crater 70 remains, as shown in FIG. 2C. After the plasma etch process is complete and the plasma 64 has been extinguished, the substrate 12 may be extracted from the plasma processing system 50 and reinserted into the non-plasma processing system 18 for further non-plasma etch processing. The non-plasma etch process may include another COR process in 72 or any other method of etching or processing, as known to those of ordinary skill in the art.

Figure 2D:
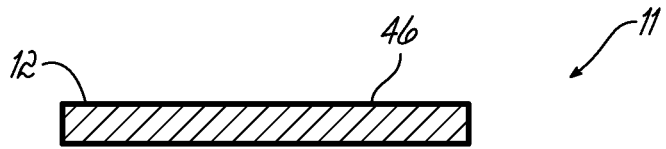

As before, if the COR process is observed to sufficiently slow or stop, then the decision in 74 is "YES" and the process may return the substrate 12 to the plasma processing system 50 (FIG. 3B) for further contamination removal. Otherwise, the decision in 74 is "NO" and the process continues. If the substrate 12 has been etched to the desired thickness such that the process is complete as shown in FIG. 2D, then the decision in 76 is "YES" and the method ends; otherwise the decision in 76 is "NO" and the process returns for further COR processing in 72. Though not shown, but if desired, another PHT process may follow completion of the COR processing in 72.

Turning now to FIGS. 4A-4F, a series of cross-sectional views of the processing of a device 80 in accordance with another embodiment of the present invention is shown. In particular, the device 80 includes a base 82 formed of a material that is desired to remain after the etching process is complete. Suitable base materials may include, for example, metallic materials, such as Ti, Ta, and Al-containing materials; insulating materials, such as silicon carbide, silicon nitride, and SiCOH; and high-k dielectric materials, such as Hf, Zr, and Al-containing dielectrics. The device 80 includes at least one feature 84 including a filler oxide material 86, for example, TEOS based $SiO_2$, flowable oxide, low temperature oxides, plasma-based oxides, and at least one contaminant 88 occluded therein.

Figure 4A:
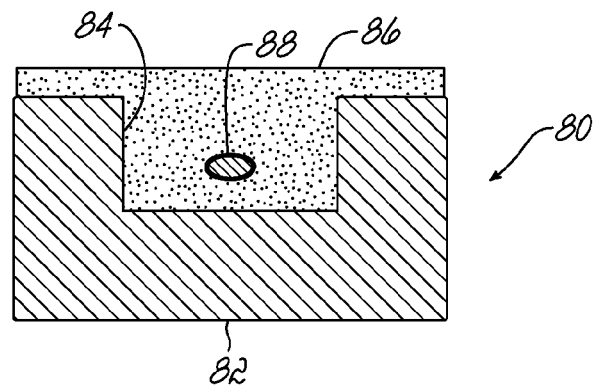
FIGS. 4A-4F are a series of cross-sectional views of another substrate being processed in accordance with the method of FIG. 1.
Figure 4B:
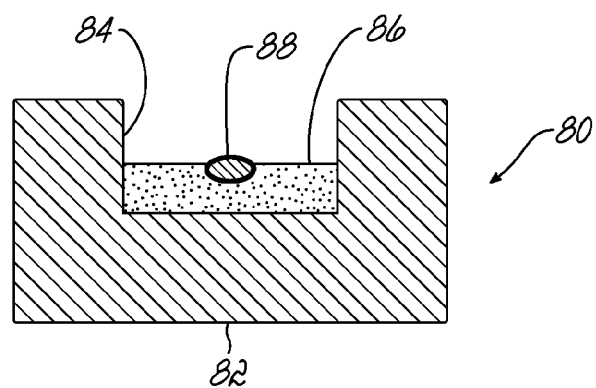

As was described with reference to FIG. 1, the device 80 may be positioned in the non-plasma process system 18 (FIG. 3A) and the filler 86 is etched until the contaminant 88 becomes exposed by the etching process, as shown in FIG. 4B. Such exposure is observed as a significant decrease, or a complete stop, of the etching rate.

Figure 4C:
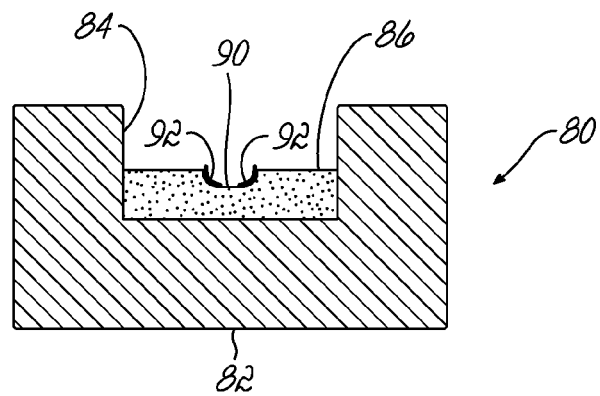

With the contaminant 88 exposed, a plasma etch process, such as the process described above, may begin selectively etching the contaminant 88. FIG. 4C illustrates the device 80 after the plasma etch process is complete and including a crater 90 formed within the filler 86. However, the shape of the particular contaminant 88 prevented complete removal of the contaminant material and at least one remnant 92 remains. In the particular illustrative example, the remnant 92 remains along the side walls of the crater 90, beneath a portion of the exposed surface of the filler 92 and where anisotropically-directed ions do not impact during plasma etch processing.

Figure 4D:
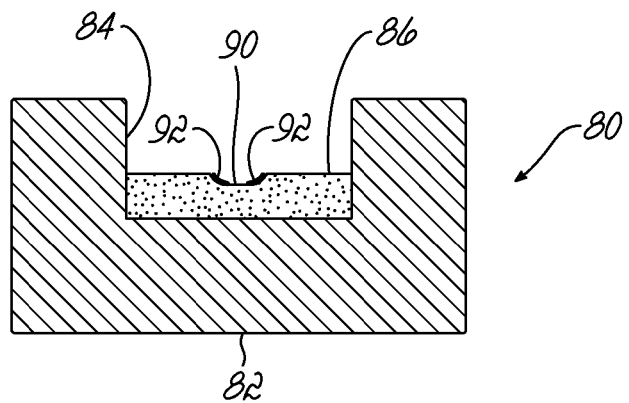
Figure 4E:
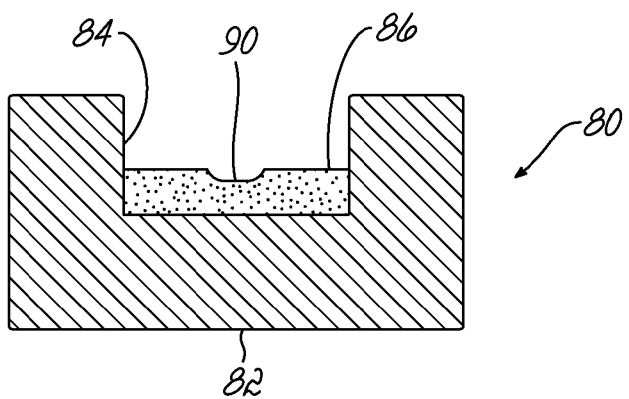
Figure 4F:
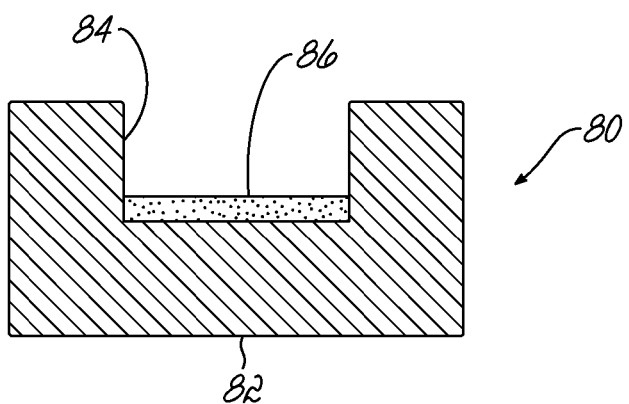

The method may continue, as was provided in FIG. 1, and includes a second non-plasma etch process. Again, the COR process is one exemplary process suitable for such oxide etching. After this additional non-plasma etch process, and as shown in FIG. 4D, the remnant 92 is accessible from the exposed surface of the filler 86. The plasma etch process may then be repeated to remove the remnant 92, as shown in FIG. 4E, before once again returning to the non-plasma etch process. The method may continuing alternating between plasma and non-plasma etch processes until the desired thickness of the filler 86 is achieved and shown in FIG. 4F.

Figure 5A:
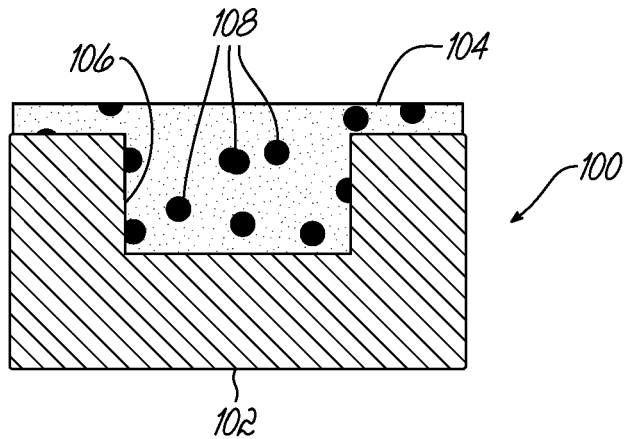
FIGS. 5A-5C are a series of cross-sectional views of still another substrate being processed in accordance with the method of FIG. 1.
Figure 5B:
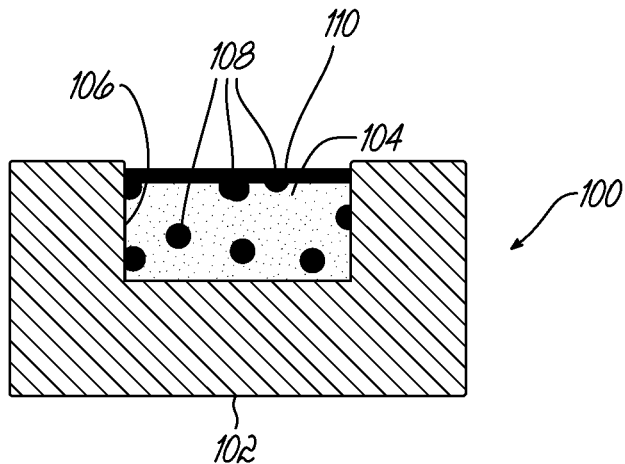
Figure 5C:
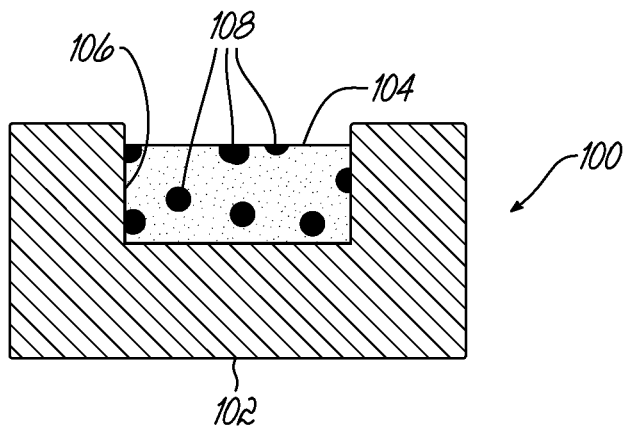

Turning now to FIGS. 5A-5C, the processing of another device 100 is described in greater detail. Specifically, and as shown in FIG. 5A, the device 100 may include a base 102 that is similar to the base 82 (FIG. 4A) described above. An oxide-based filler 104, for example, a tetraethyl orthosilicate ("TEOS") layer, fills at least one feature 106 in the base 102 and includes a carbon-based contaminant 108 dispersed therein.

As noted above, the process may begin with an oxide-etch process, such as the COR, non-plasma processing described previously. However, in FIG. 5B, as the TEOS layer 104 is etched, the dispersed contaminant is concentrated into a carbonaceous film 110 on the surface of the TEOS layer 104. Accordingly, and as was previously described, the etching rate of the TEOS layer 104 will significantly decrease and/or stop with formation of the carbonaceous film 110.

To remove the carbonaceous film 110, the device 100 may be plasma etched in the manner described in greater detail above. Plasma etch processing removes the carbonaceous film 110 for further non-plasma processing. The method continues with alternating plasma and non-plasma etch processes to remove further concentrations of carbonaceous film 110 and until the desired thickness of the TEOS layer 104 is achieved (FIG. 5C).

While it is not specifically shown herein, a single processing chamber may be used for both the non-plasma and the plasma etch processes. In this way, the substrate would not be exchanged between processing chambers. One system suitable for use in this manner may include the commercially-available TELIUS etch system from Tokyo Electron Limited (Minato-ku, Tokyo), and would include, at a minimum, plasma power generators, processing gas supplies for completing the oxide etch process, reactive gas supplies for the plasma contamination removal, and an active substrate support control system with temperature control.

Figure 6:
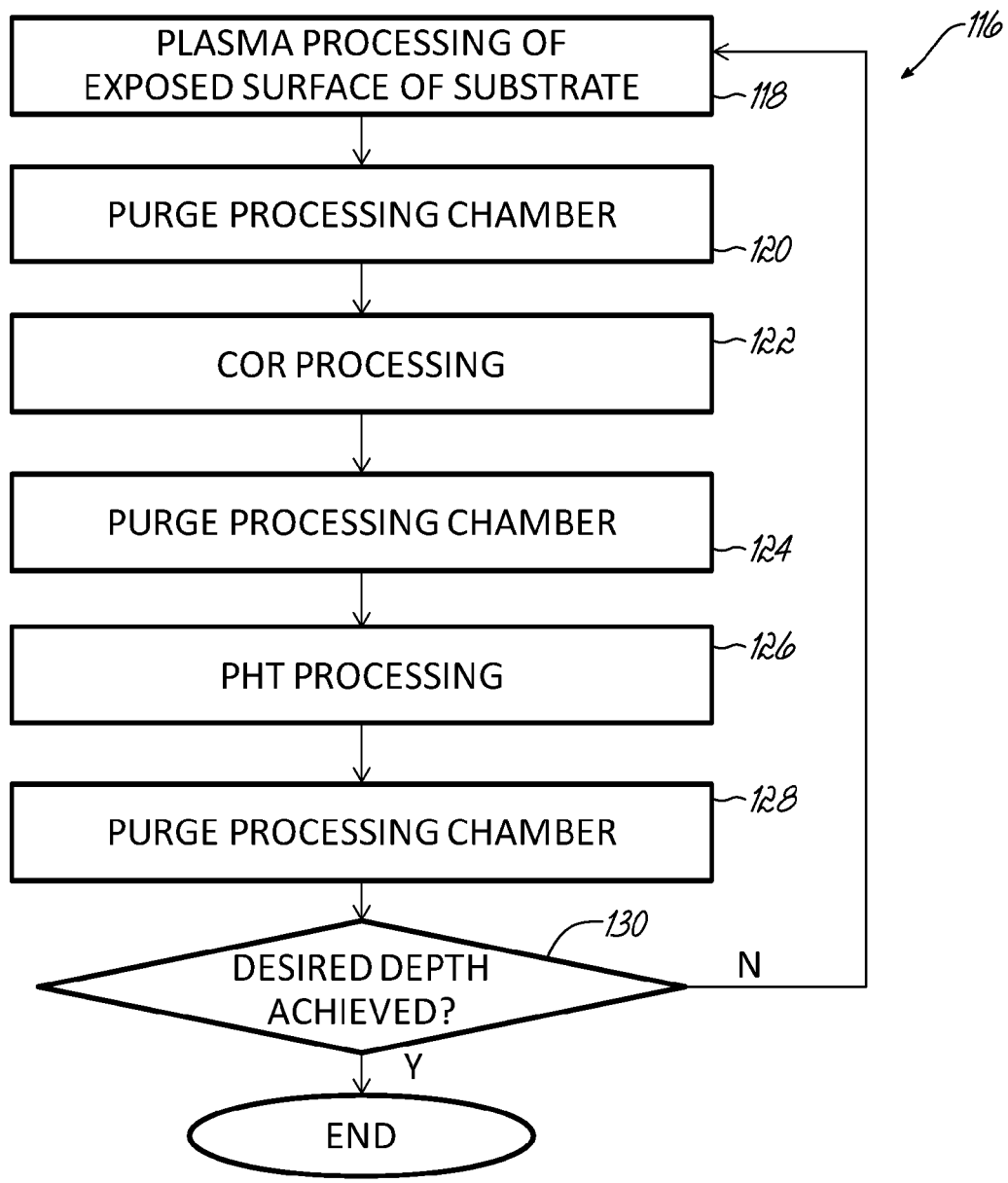
FIG. 6 is a flow chart illustrating one exemplary method of forming a semiconductor device in accordance with one embodiment of the present invention.

One method of processing a substrate with a single processing chamber system is shown in the flow chart of FIG. 6. More specifically, after the substrate is positioned within the single processing chamber, the surface of the substrate may be plasma etched in 118, as was described previously. The initial plasma etch process cleans the exposed surface of the substrate and may be, alternatively, preceded with a non-plasma etch process, as provided in FIG. 1. After the plasma etch process, the processing chamber is purged in 120 and the COR non-plasma etch process begins in 122. After terminating the COR process and again purging the processing chamber in 124, a PHT process may be used in 126 to sublime materials formed on the exposed surface of the substrate. After a final purge of the processing chamber in 128, a determination is made in 130 of whether the desired depth of the oxide layer has been achieved. If the oxide-layer remains too thick such that the decision in 130 is "NO", then the process returns for further plasma etch process in 118. Otherwise, the decision in 130 is "YES" and the process may end.

While not specifically illustrated herein, it would be understood that the processing of an oxide layer in accordance with an embodiment of the present invention may be performed on any device containing an oxide layer and that may include other features, vias, gates, resist layers, and so forth.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method for forming a semiconductor device, the method comprising:
    providing a substrate containing a first material and a second material occluded by the first material;
    etching the first material using a first non-plasma etch process that etches the first material at a higher etch rate relative to a rate of etching the second material to expose the second material that is overlying at least a portion of the first material;
    etching the second material using a plasma containing a reactive gas to expose the at least a portion of the first material; and
    etching the first material, including the at least a portion of the first material exposed by etching the second material, by a second non-plasma etch process.

2. The method of claim 1, wherein the second material is embedded or dispersed within the first material.

3. The method of claim 1, wherein the second material is dispersed within the first material and concentrates into a surface film during the first non-plasma etch process.

4. The method of claim 1, wherein the first non-plasma etch process and/or the second non-plasma etch process is a chemical oxide removal process.

5. The method of claim 1, wherein the reactive gas includes a redox agent, the redox agent selected from the group consisting of $N_2$, $H_2$, $O_2$, $CO_2$, and $NH_3$, and a combination thereof.

6. The method of claim 5, wherein the reactive gas further includes an inert gas and/or a fluorinated gas.

7. The method of claim 6, wherein the inert gas is selected from the group consisting of Ar, He, and Ne, and a combination thereof, and the fluorinated gas is selected from a group consisting of $CF_4$, $CHF_3$, $CH_2F_2$, and $CH_3F$, and a combination thereof.

8. The method of claim 1 further comprising:
    heating the substrate to sublime one or more by-product materials formed on a surface of the substrate and/or a surface of the first material during the first non-plasma etch process and/or the second non-plasma etch process.

9. The method of claim 1 further comprising:
determining a depth of the first material; and
optionally, further etching the second material using the plasma or etching the residual first material and the first material by the second non-plasma etch process.

10. A method for forming a semiconductor device, the method comprising:
providing a substrate containing an oxide material and a carbon material occluded by the oxide material;
etching the oxide material using a first chemical oxide removal process that etches the oxide material at a higher rate relative to a rate of etching the carbon material to expose the carbon material that is overlying at least a portion of the oxide material;
etching the carbon material using a plasma containing a reactive gas to expose the at least a portion of the oxide material; and
etching the oxide material, including the at least a portion of the oxide material exposed by etching the carbon material, by a second chemical oxide removal process.

11. The method of claim 10, wherein the carbon material is embedded or dispersed within the oxide material.

12. The method of claim 10, wherein the carbon material is dispersed within the oxide material and concentrates into a carbonaceous film on a surface of the oxide material during the first chemical oxide removal process.

13. The method of claim 10, wherein the reactive gas includes a redox agent, the redox agent selected from the group consisting of $N_2$, $H_2$, $O_2$, $CO_2$, and $NH_3$, and a combination thereof.

14. The method of claim 13, wherein the reactive gas further includes an inert gas and/or a fluorinated gas.

15. The method of claim 14, wherein the inert gas is selected from the group consisting of Ar, He, and Ne, and a combination thereof, and the fluorinated gas is selected from a group consisting of $CF_4$, $CHF_3$, $CH_2F_2$, and $CH_3F$, and a combination thereof.

16. The method of claim 10 further comprising:
heating the substrate to sublime one or more by-product materials formed on a surface of the substrate and/or a surface of the oxide material during the first chemical oxide removal process and/or the second chemical oxide removal process.

17. The method of claim 10 further comprising:
determining a depth of the oxide material; and
optionally, further etching the carbon material using the plasma or etching the residual oxide material and the oxide material by the second chemical oxide removal process.

18. A method of forming a semiconductor device, the method comprising:
(a) providing a substrate having an oxide material and an occluded carbon material;
(b) etching the oxide material with a non-plasma etch process that is configured to etch the oxide material at a rate that is higher than a rate of etching the carbon material and to expose the carbon material;
(c) etching the exposed carbon material with a plasma comprising a reactive gas; and
(d) etching the oxide material with a non-plasma etch process;
(e) determining a thickness of the oxide material; and
(f) either (1) terminating etching when the determined thickness equals a predetermined thickness of the oxide material or (2) repeating (c), (d), and (e) until the determined thickness is approximately the predetermined thickness.

19. The method of claim 18, wherein the carbon material is dispersed within the oxide material and concentrates into a carbonaceous film during the non-plasma etch process.

* * * * *